(12) United States Patent
Kuo et al.

(10) Patent No.: US 12,550,764 B2
(45) Date of Patent: Feb. 10, 2026

(54) LAYOUT STRUCTURE OF FLEXIBLE CIRCUIT BOARD

(71) Applicant: CHIPBOND TECHNOLOGY CORPORATION, Hsinchu (TW)

(72) Inventors: Hou-Chang Kuo, Kaohsiung (TW); Wen-Ping Hsu, Kaohsiung (TW); Ting-Yi Kuo, Kaohsiung (TW); Yi-Ling Hsieh, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 227 days.

(21) Appl. No.: 18/614,963

(22) Filed: Mar. 25, 2024

(65) Prior Publication Data

US 2024/0371741 A1 Nov. 7, 2024

(30) Foreign Application Priority Data

May 4, 2023 (TW) .................................. 112116674

(51) Int. Cl.
*H05K 1/02* (2006.01)
*H01L 23/498* (2006.01)

(52) U.S. Cl.
CPC .... *H01L 23/49838* (2013.01); *H01L 23/4985* (2013.01)

(58) Field of Classification Search
CPC ........... H05K 1/11; H05K 1/18; H05K 1/0265
See application file for complete search history.

(56) References Cited

U.S. PATENT DOCUMENTS

| 8,766,451 | B2 * | 7/2014 | Chen | ................... | H01L 23/4985 |
| | | | | | 257/691 |
| 2006/0016619 | A1 * | 1/2006 | Jang | ....................... | H05K 1/111 |
| | | | | | 174/250 |

(Continued)

FOREIGN PATENT DOCUMENTS

| CN | 112770480 A | 5/2021 |
| CN | 112825600 A | 5/2021 |

(Continued)

OTHER PUBLICATIONS

Japanese office action mailed Aug. 21, 2024 for Japanese patent application No. 2023-108503, 6 pages.

(Continued)

*Primary Examiner* — Sherman Ng
(74) *Attorney, Agent, or Firm* — Demian K. Jackson; Jackson IPG PLLC

(57) ABSTRACT

A layout structure of a flexible circuit board includes a flexible substrate, a circuit layer and a dummy circuit layer which are arranged on the flexible substrate. The circuit layer includes first inner leads, second inner leads, an inverted U-shape connection line and a horizontal inner lead. A first distance between the first inner leads is less than a second distance between the second inner leads. One of dummy leads of the dummy circuit layer is located between the first and second inner leads, another dummy lead is located between the second inner leads. The dummy leads are provided to allow lead spaces on both sides of the inverted U-shape connection line is the same. Thus, etching solution will not flow laterally in an etching space between the inverted U-shape connection line and the horizontal inner lead.

10 Claims, 3 Drawing Sheets

(56) References Cited

U.S. PATENT DOCUMENTS

| | | | |
|---|---|---|---|
| 2006/0175088 A1* | 8/2006 | Lin | H01L 23/3121 |
| | | | 257/E23.125 |
| 2007/0080432 A1* | 4/2007 | Liu | H01L 24/86 |
| | | | 257/666 |
| 2021/0265255 A1 | 8/2021 | Ma et al. | |
| 2022/0104354 A1* | 3/2022 | Ma | H05K 1/118 |

FOREIGN PATENT DOCUMENTS

| | | | |
|---|---|---|---|
| CN | 113133183 A | 7/2021 | |
| CN | 114340148 A | 4/2022 | |
| CN | 115226287 A | 10/2022 | |
| JP | 55-48995 A | 4/1980 | |
| JP | 64-59832 A | 3/1989 | |
| JP | 1-260884 A | 10/1989 | |
| JP | 2002-232116 A | 8/2002 | |
| JP | 2011-29601 A | 2/2011 | |
| KR | 10-2018-0027685 A | 3/2018 | |
| KR | 10-2022-0043823 A | 4/2022 | |
| TW | 202121946 A | 6/2021 | |
| TW | 202133370 A | 9/2021 | |
| TW | 202214053 A | 4/2022 | |

OTHER PUBLICATIONS

Taiwanese invalidation document provided by invalidation requester for Taiwanese invention No. I845296 (filing No. 112116674), mailed Aug. 30, 2024, 50 pages.

Japanese office action mailed Feb. 10, 2025 for Japanese patent application No. 2023-108503, 3 pages.

Korean office action mailed Mar. 17, 2025 for Korean patent application No. 10-2023-0086359, 8 pages.

Chinese notice of allowance mailed Sep. 2, 2025 for Chinese patent application No. 202310741688.8, 4 pages.

Taiwanese Office Action mailed Oct. 4, 2023 for Taiwanese Patent Application No. 112116674, 3 pages.

\* cited by examiner

LAYOUT STRUCTURE OF FLEXIBLE CIRCUIT BOARD

CROSS-REFERENCE TO RELATED APPLICATIONS

This application claims priority to R.O.C patent application No. 112116674 filed May 4, 2023, the disclosure of which is hereby incorporated by reference in its entirety.

FIELD OF THE INVENTION

This invention relates to a flexible circuit board, and more particularly to a layout structure of a flexible circuit board.

BACKGROUND OF THE INVENTION

Current display devices are thin, light in weight and frameless particularly, and display driver ICs are flexible and bendable because they are arranged on flexible substrates. Hence, control circuit boards can be mounted on back side of display panel and electrically connected to electrodes on front side of the display panel via the bent driver ICs, thereby obtaining frameless display devices. Conventional flexible circuit board includes a flexible substrate and a circuit layer located on the flexible substrate. A metal layer on the flexible substrate is etched to become the patterned circuit layer in lithographic process, a photoresist is provided on the metal layer where the circuit lines are predetermined, and the metal layer not covered by the photoresist is etched by the etching solution, so flow of the etching solution is important to quality of the circuit lines. Different line density on the flexible circuit board may lead the etching solution flowing vertically have different flow rates during etching process and may further induce lateral flow of the etching solution. The etching solution flowing laterally may cause undercut and metal-residue issues in the narrow space between the circuit lines.

SUMMARY OF THE INVENTION

One object of the present invention is to provide a dummy lead between second inner leads with wider space such that the distance between the dummy lead and the second inner lead is identical to that between adjacent first inner leads. Owing to lead spaces on both sides of an inverted U-shape connection line are similar in size, it is possible to avoid an etching solution from flowing laterally through an etching space between the inverted U-shape connection line and a horizontal inner lead.

A layout structure of a flexible circuit board of the present invention includes a flexible substrate, a circuit layer and a dummy circuit layer. A chip mounting area is defined on a surface of the flexible substrate, and multiple first bump locations and second bump locations are predetermined within the chip mounting area. The circuit layer is located on the surface and includes first inner leads, second inner leads, an inverted U-shape connection line and a horizontal inner lead. First terminals of the first inner leads are arranged on the first bump locations, and second terminals of the second inner leads are arranged on the second bump locations. A first distance between the adjacent first inner leads is less than a second distance between the adjacent second inner leads. The inverted U-shape connection line involves a first connection part, a second connection part and a horizontal part which is located between the first and second connection parts. The first connection part is connected to the first terminal of one of the first inner leads, and the second connection part is connected to the first terminal of another first inner lead. The horizontal inner lead is located within the chip mounting area and adjacent to the horizontal part of the inverted U-shape connection line. An etching space exists between the horizontal inner lead and the horizontal part. The dummy circuit layer includes dummy leads, one of the dummy leads is located between the first and second inner leads, and another dummy lead is located between the adjacent second inner leads. A difference between the first distance and a third distance from the dummy lead to the adjacent second inner lead is less than 5 μm.

Because of the dummy leads of the dummy circuit layer, space size between the leads on one side of the etching space is almost equal to that between the leads on the other side of the etching space. Consequently, flow rate difference of an etching solution on both sides of the etching space can be reduced to avoid the etching solution from flowing laterally through the etching space and further avoid undercut caused by lateral flow of the etching solution.

DETAILED DESCRIPTION OF THE INVENTION

Figure 1:
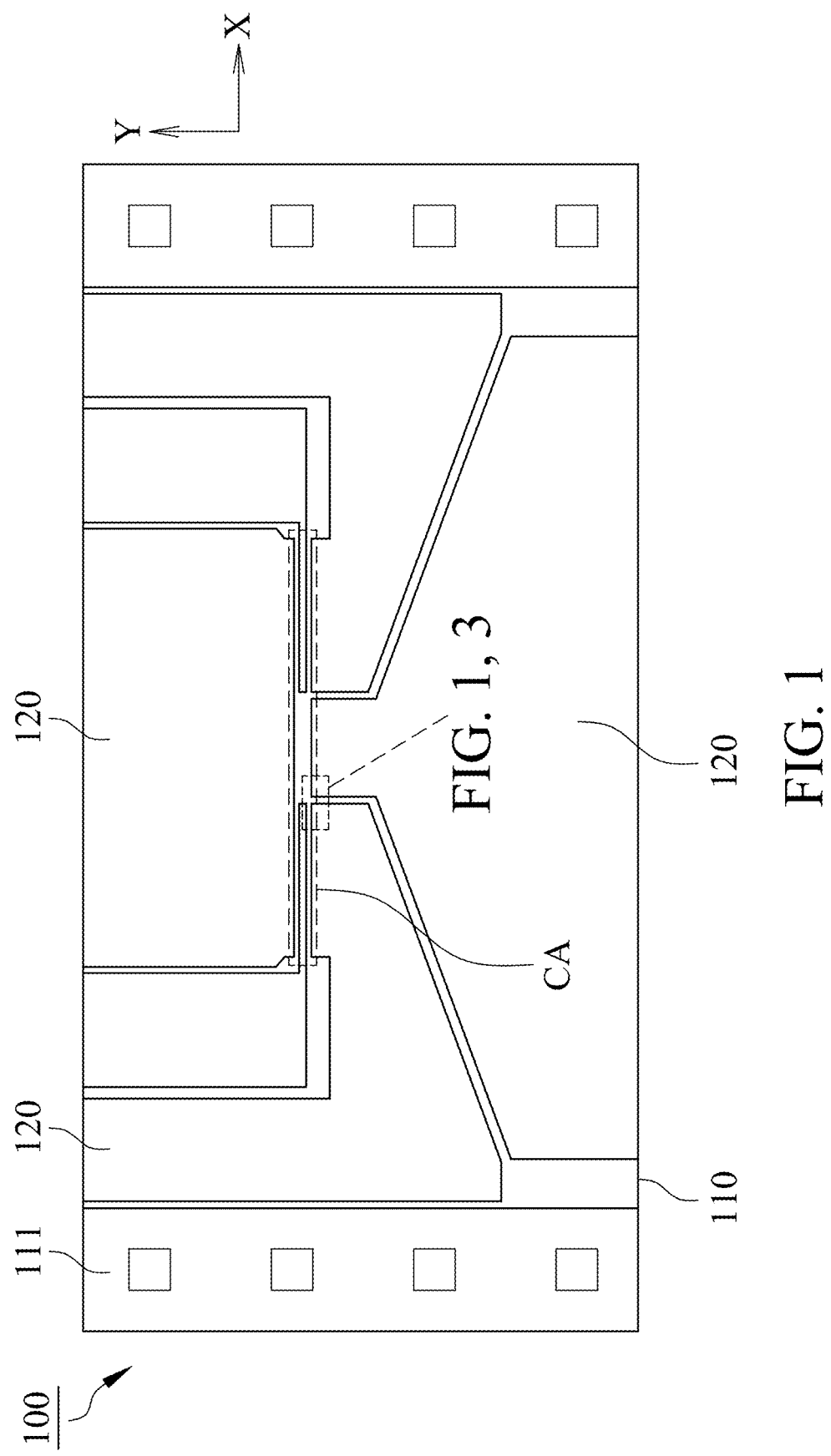
FIG. 1 is a top view diagram illustrating a layout structure of a flexible circuit board in accordance with one embodiment of the present invention.
Figure 2:
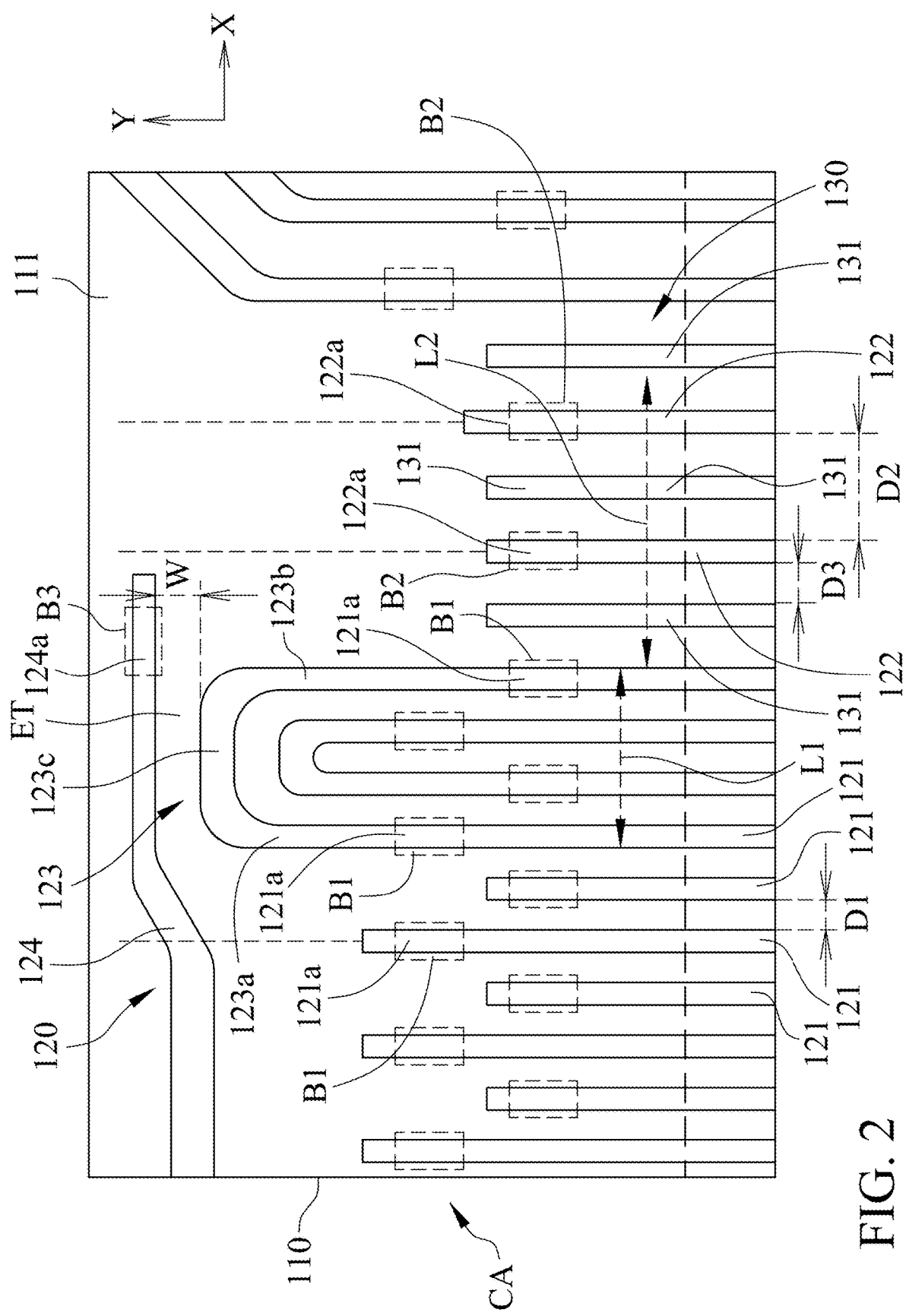
FIG. 2 is a top view diagram illustrating a part of a layout structure of a flexible circuit board in accordance with a first embodiment of the present invention.

One embodiment of the present invention is illustrated in FIGS. 1 and 2. FIG. 1 is a top view diagram of a layout structure of a flexible circuit board 100, and FIG. 2 is a partial enlarged diagram of FIG. 1 to illustrate a first embodiment of the present invention. The layout structure of the flexible circuit board 100 includes a flexible substrate 110 and a circuit layer 120 which is arranged on a surface 111 of the flexible substrate 110. A chip mounting area CA is defined on the surface 111, and a plurality of first bump locations B1 and second bump locations B2 are defined within the chip mounting area CA. A die (not shown) can be flip-mounted on the chip mounting area CA to allow a plurality of first bumps and second bumps on the die to be bonded to the first bumps locations B1 and the second bump locations B2. The circuit layer 120 including fine circuit lines is simplified as a blank area in FIG. 1.

The circuit layer 120 includes a plurality of first inner leads 121, a plurality of second inner leads 122, an inverted U-shape connection line 123 and a horizontal inner lead 124. A first terminal 121a of each of the first inner leads 121 is arranged on one of the first bump locations B1 and provided to be electrically connected to one of the first bumps on the die, thus the first bumps can transmit signals via the first inner leas 121.

A second terminal 122a of each of the second inner leads 122 is arranged on one of the second bump locations B2 to be electrically connected to one of the second bumps on the die, so the second bumps can transmit signal via the second inner leads 122. A second distance D2 between the adjacent second inner leads 122 is wider than a first distance D1 between the adjacent first inner leads 121.

The inverted U-shape connection line 123 includes a first connection part 123a, a second connection part 123b and a horizontal part 123c which are shaped like inverted U. The horizontal part 123c is located between the first and second connection parts 123a and 123b, and both ends of the horizontal part 123c are connected to the first and second connection parts 123a and 123b, respectively. The first connection part 123a is connected to the first terminal 121a of one of the first inner leads 121, the second connection part 123b is connected to the first terminal 121a of another one of the first inner leads 121. After flip bonding the die on the chip mounting area CA, two first bumps on the die can be electrically connected to the first terminals 121a of two first inner leads 121 and can transmit signals via the inverted U-shape connection line 123 which is connected to the first terminals 121a of two first inner leads 121.

The horizontal inner lead 124 is located on the chip mounting area CA and its horizontal terminal 124a is arranged on a third bump location B3 defined on the chip mounting area CA, so the horizontal inner lead 124 can be electrically connected to a third bump of the die while the die is flip mounted on the chip mounting area CA. The horizontal inner lead 124 is adjacent to the horizontal part 123c of the inverted U-shape connection line 123. An etching space ET exists between the horizontal inner lead 124 and the horizontal part 123c of the inverted U-shape connection line 123, and a width W of the etching space ET is less than 25 μm.

With reference to FIG. 1, in the embodiment, the flexible circuit board 100 is transported by roll-to-roll system during etching process. In conventional, flexible circuit boards are connected to one another as a tape, the tape is immersed in an etching solution, both ends of the tape are rolled on a reel to allow the flexible circuit boards to be moved in the etching solution, and metal layers which are located on the flexible substrates and not covered by photoresists are etched by the etching solution to become patterned circuit lines. In the embodiment, the tape including the flexible circuit boards is transported in a vertical direction as Y axis shown in diagrams, namely, the etching solution is moved through the flexible circuit boards in the vertical direction. Referring to FIG. 2, the second distance D2 between the second inner leads 122 is greater than the first distance D1 between the first inner leads, so the space between the second inner leads 122 is larger than that between the first inner leads 121, and that will lead the etching solution flowing through the space between the second inner leads 122 at a faster rate than between the first inner leads 121. Different flow rates of the etching solution on both sides of the etching space ET may cause the etching solution on one side of the etching space ET have a pressure different to that on the other side of the etching space ET, and the pressure difference may push the etching solution to flow through the etching space ET in a lateral direction as X axis shown in diagrams. The etching space ET with narrower width becomes an undesired lateral channel of the etching solution, undercut in the etching space ET caused by lateral flow of the etching solution is usually observed, and over etching may occur on side walls of the horizontal inner lead 124 and the horizontal part 123c in the etching space ET. Otherwise, metal debris from the horizontal inner lead 124 and the horizontal part 123c which are over-etched may be left in the etching space ET to become metal residues.

Referring to FIG. 2, in order to avoid the etching solution from flowing laterally through the etching space ET, the layout structure of the flexible circuit board 100 in accordance with the first embodiment of the present invention further includes a dummy circuit layer 130 which includes a plurality of dummy leads 131. The dummy leads 131 are not arranged on bump locations so no currents flow through the dummy leads 131. One of the dummy leads 131 is located between one of the first inner leads 121 and one of the second inner leads 122, and another dummy lead 131 is located between the adjacent second inner leads 122. A difference between the first distance D1 and a third distance D3 which is between the dummy lead 131 and the adjacent second inner lead 122 is less than 5 μm (+5 μm). In the present invention, the dummy leads 131 arranged in the space between the adjacent second inner leads 122 are provided to allow the space between the adjacent leads located on one side of the etching space ET to be almost the same as that between the leads located on the other side of the etching space ET. As a result, flow rates of the etching solution on both sides of the etching space ET are similar, the etching solution will not flow laterally through the etching space ET to cause undercut in the etching space ET. Preferably, the third distance D3 can be designed to be equal to the third distance D1 by adjusting width of the dummy leads 131 such that lead spaces on both sides of the etching space ET are identical in size.

In the first embodiment, the space between the first inner lead 121 and the second inner lead 122 and the space between the adjacent second inner leads 122 are designed to be smaller, only one dummy lead 131 is required to be arranged in the space between the first inner lead 121 and the second inner lead 122 and the space between the adjacent second inner leads 122. In other embodiments, if the space between the first inner lead 121 and the second inner lead 122 or the space between the adjacent second inner leads 122 is wider, two or more dummy leads 131 can be arranged in the space between the first inner lead 121 and the second inner lead 122 or the space between the adjacent second inner leads 122 to allow the third distance D3 to be almost the same as the first distance D1.

With reference to FIG. 2, a first length L1 defined from the first connection part 123a to the second connection part 123b of the inverted U-shape connection line 123 is less than 200 μm. The short the length of the etching space ET, the faster the rate of the etching solution flowing in the etching space ET to cause more severe undercut in the etching space ET. For this reason, the dummy leads 131 are provided in this embodiment to stop lateral flow of the etching solution and significantly prevent undercut issue in the etching space ET.

Referring to FIG. 2, in the first embodiment, lateral flow of the etching solution is more easily observed between the leads closer to the inverted U-shape connection line 123 than that father from the inverted U-shape connection line 123. For example, the dummy leads 131 of the first embodiment are required on the area within 1000 μm from the second connection part 123b of the inverted U-shape connection line 123 to allow the space between the adjacent leads on one side of the inverted U-shape connection line 123 to be similar to that between the adjacent leads on the other side of the inverted U-shape connection line 123. Thus, a second length L2 defined from the dummy leads 131 to the second connection part 123b of the inverted U-shape connection line 123 is less than or equal to 1000 μm.

As shown in FIG. 2, the first inner leads 121 are parallel to the second inner leads 122, an angle is between the horizontal part 123c and the first inner leads 121 and between the horizontal part 123c and the second inner leads 122. In this embodiment, the angle is 90 degrees to allow the horizontal part 123c to be perpendicular to the first inner leads 121 and the second inner leads 122, however the etching solution flowing laterally may cause more severe undercut in the etching space ET. In other embodiments, the angle between the horizontal part 123c and the first inner leads 121 and between the horizontal part 123c and the second inner leads 122 can be designed to between 30 and 150 degrees, but the etching solution may still flow through the etching space ET laterally to cause undercut. For this reason, this embodiment utilizes the dummy leads 131 to allow the etching solution to flow at the same rate on both sides of the etching space ET, stop lateral flow of the etching solution, and avoid undercut in the etching space ET even if the angle between the horizontal part 123c and the first inner leads 121 and between the horizontal part 123c and the second inner leads 122 is from 30 to 150 degrees.

With reference to FIG. 2, a first imaginary line extending from the first inner leads 121 passes through the horizontal inner lead 124, so flow rate of the etching solution flowing through the space between the first inner leads 121 will slow down by the horizontal inner lead 124. In contrast, a second imaginary line extending from the second inner leads 122 does not pass through the horizontal inner lead 124, the etching solution flowing through the space between the second inner leads 122 will not block by the horizontal inner lead 124 with faster rate. Furthermore, the second distance D2 between the second inner leads 122 is greater than the first distance D1 between the first inner leads 121, so flow rate of the etching solution on one side of the etching space ET is different to that on the other side of the etching space ET, that may cause lateral flow of the etching solution and further cause undercut in the etching space ET. In the embodiment, flow rate difference of the etching solution on both sides of the etching space ET can be substantially reduced to prevent the etching solution from flowing laterally through the etching space ET.

Figure 3:
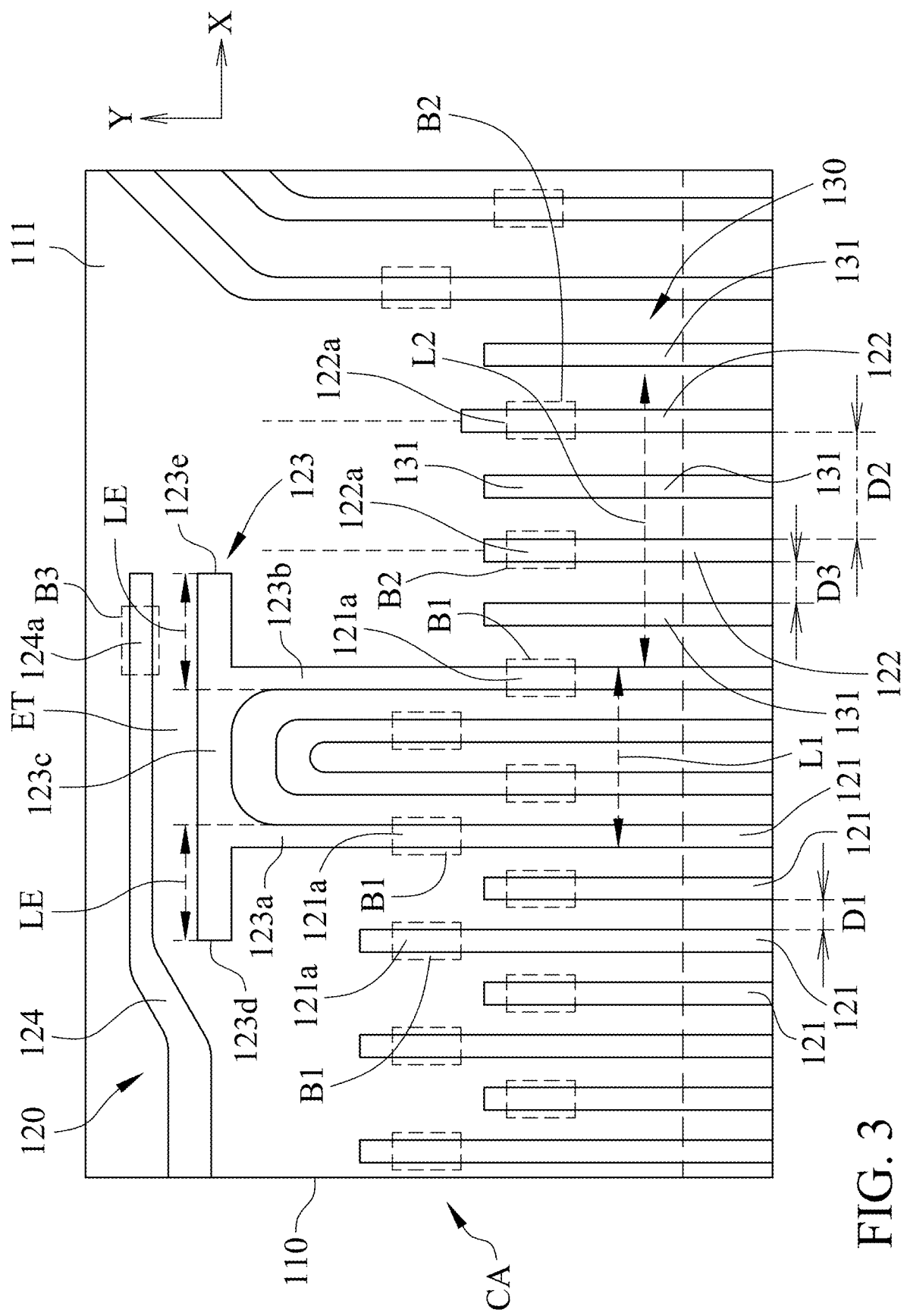
FIG. 3 is a top view diagram illustrating a part of a layout structure of a flexible circuit board in accordance with a second embodiment of the present invention.

FIG. 3 is a partial enlarged diagram of FIG. 1 and provided to illustrate a second embodiment of the present invention. Different to the first embodiment as shown in FIG. 2, the inverted U-shape connection line 123 of the second embodiment further includes a first protruding part 123d and a second protruding part 123e. The first protruding part 123d is connected to the first connection part 123a and the horizontal part 123c, and it protrudes from the first connection part 123a. The second protruding part 123e is connected to the second connection part 123b and the horizontal part 123c and protrudes from the second connection part 123b. The first protruding part 123d and the second protruding part 123e have a length LE of from 50 to 100 μm. The first protruding part 123d and the second protruding part 123e are provided to increase overall length of the etching space ET such that the rate of the etching solution flowing through the etching space ET laterally can be lower to avoid undercut in the etching space ET.

The dummy leads 131 of the circuit layer 130 are provided to equal lead spaces on both sides of the etching space ET, thereby reducing flow rate difference of the etching solution between two sides of the etching space ET and further avoiding undercut caused by lateral flow of the etching solution in the etching space ET.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

The invention claimed is:

1. A layout structure of flexible circuit board comprising:
   a flexible substrate including a surface where a chip mounting area is defined on, a plurality of first bump locations and a plurality of second bump locations are defined within the chip mounting area;
   a circuit layer disposed on the surface and including a plurality of first inner leads, a plurality of second inner leads, an inverted U-shape connection line and a horizontal inner lead, a first terminal of each of the plurality of first inner leads is arranged on one of the plurality of first bump locations, a second terminal of each of the plurality of second inner leads is arranged on one of the plurality of second bump locations, a second distance between the adjacent second inner leads is greater than a first distance between the adjacent first inner leads, the inverted U-shape connection line includes a first connection part, a second connection part and a horizontal part which is located between the first and second connection parts, the first connection part is connected to the first terminal of one of the plurality of first inner leads, the second connection part is connected to the first terminal of another one of the plurality of first inner leads, the horizontal inner lead is located on the chip mounting area and adjacent to the horizontal part of the inverted U-shape connection line, there is an etching space between the horizontal inner lead and the horizontal part; and
   a dummy circuit layer including a plurality of dummy leads, one of the plurality of dummy leads is located between one of the plurality of first inner leads and one of the plurality of second inner leads, another one of the plurality of dummy leads is located between the adjacent second inner leads, wherein a difference between the first distance and a third distance from one of the plurality of dummy leads to the adjacent second inner lead is less than 5 μm.

2. The layout structure of flexible circuit board in accordance with claim 1, wherein a width of the etching space is less than 25 μm.

3. The layout structure of flexible circuit board in accordance with claim 1, wherein a first length between the first and second connection parts of the inverted U-shape connection line is less than 200 μm.

4. The layout structure of flexible circuit board in accordance with claim 1, wherein a second length from each of the plurality of dummy leads to the second connection part of the inverted U-shape connection line is less than or equal to 1000 μm.

5. The layout structure of flexible circuit board in accordance with claim 1, wherein the inverted U-shape connection line further includes a first protruding part and a second protruding part, the first protruding part is connected to the first connection part and the horizontal part and protrudes the first connection part, the second protruding part is connected to the second connection part and the horizontal part and protrudes from the second connection part, the first and second protruding parts have a length between 50 μm and 100 μm.

6. The layout structure of flexible circuit board in accordance with claim 1, wherein the plurality of first inner leads are parallel to the plurality of second inner leads, an angle between the horizontal part and the plurality of first inner leads and between the horizontal part and the plurality of second leads is from 30 degrees to 150 degrees.

7. The layout structure of flexible circuit board in accordance with claim 6, wherein the angle is 90 degrees.

8. The layout structure of flexible circuit board in accordance with claim 6, wherein the horizontal inner lead is passed through by a first imaginary line extending from the plurality of first inner leads and not passed through by a second imaginary line extending from the plurality of second inner leads.

9. The layout structure of flexible circuit board in accordance with claim 1, wherein more than one of the plurality of dummy leads is located between one of the plurality of first inner leads and one of the plurality of second inner leads.

10. The layout structure of flexible circuit board in accordance with claim 1, wherein the third distance is equal to the first distance.

* * * * *